United States Patent [19]

Seyferth et al.

[11] Patent Number: 4,639,501

[45] Date of Patent: Jan. 27, 1987

[54] METHOD FOR FORMING NEW PRECERAMIC POLYMERS CONTAINING SILICON

[75] Inventors: Dietmar Seyferth, Lexington, Mass.; Yuan-Fu Yu, Dayton, Ohio

[73] Assignee: Massachusetts Institute of Technology, Cambridge, Mass.

[21] Appl. No.: 772,375

[22] Filed: Sep. 4, 1985

[51] Int. Cl.$^4$ .............................................. C08G 77/06
[52] U.S. Cl. ........................................ 528/15; 522/99;
522/172; 501/88; 501/90; 501/92; 423/345;
423/347; 528/21; 528/24; 528/31; 528/32;
556/430
[58] Field of Search .......................... 501/88, 92, 90;
423/345, 347; 528/31, 32, 24, 15, 21;
204/159.13; 556/430; 522/99, 172

[56] References Cited

U.S. PATENT DOCUMENTS

| | | | |
|---|---|---|---|
| 3,108,985 | 10/1963 | Weyer | 260/37 |
| 3,853,567 | 12/1974 | Verbeek | 106/44 |
| 3,892,583 | 7/1975 | Winter et al. | 106/55 |
| 4,310,651 | 1/1982 | Baney et al. | 528/21 |
| 4,312,970 | 1/1982 | Gaul, Jr. | 526/279 |
| 4,537,942 | 8/1985 | Brown-Wensley et al. | 556/430 |
| 4,546,163 | 10/1985 | Haluska | 528/21 |

OTHER PUBLICATIONS

R. W. Rice, Amer. Ceram. Soc. Bull., 62: 889–892 (1983).
Penn et al., J. Appl. Polymer Sci., 27: 3751–61 (1982).
S. Yajima, Amer. Ceram. Soc. Bull., 62: 893–898; 903 (1983).
C. L. Shilling, Jr. and T. C. Williams, Technical Report ONR Contract N00014-81-C-0682 (1983).
Aitken, C. et al., J. Organomet. Chem., 279: C11–C13.
Andrianov, K. A. et al., Izv. Akad. Nauk SSSR., Otd. Khim-Nauk, 948 (1963).
Kantor, S. W. et al., J. Am. Chem. Socl., 77: 1685 (1955).
Millard, M. M. et al., J. Organomet. Chem., 52-283 (1973).
Lukevics, E. et al., J. of Organom. Chem. Kibrary, 5: 1–180 (1977).
Hurd, D. T., J. Amer. Chem. Soc., 67: 1812 (1945).

*Primary Examiner*—Melvyn I. Marquis
*Attorney, Agent, or Firm*—Robert F. O'Connell; George W. Neuner; Ronald I. Eisenstein

[57] ABSTRACT

A method of forming preceramic polymers by mixing (A) a methylpolysilane of the formula $[(RSiH)_x(RSi)_y]_n$, (where R is a lower alkyl group having from 1 to about 6 carbon atoms, a cycloalkyl group having from 3 about to 6 carbon atoms, a substituted or unsubstituted lower aryl group having from 6 to about 10 carbon atoms, a tri(lower)alkyl- or di(lower)alkylsilyl group $x+y=1$, (x and y are each $>0$ and also $x=1$, $y=o$), and n is an integer greater than 1 with (B) an organic or organisilicon compound having at least two alkenyl groups and allowing the mixture to react is disclosed. Preferably, the alkenyl group is a vinyl group. The reaction is preferably initiated by the generation of reactive free radicals. Novel preceramic polymers formed by this method are also disclosed.

42 Claims, No Drawings

METHOD FOR FORMING NEW PRECERAMIC POLYMERS CONTAINING SILICON

The Government has rights in this invention pursuant to Contract Number AFOSR-83-0003 awarded by the Department of the Air Force.

The present invention relates to a process for preparing preceramic polymers containing silicon, carbon and other elements, and for their pyrolysis to ceramic materials.

There is a great deal of interest in preceramic polymer materials which can be pyrolyzed to yield SiC, $Si_3N_4$ and other silicon-based ceramic materials. R. W. Rice, *Amer. Ceram. Soc. Bull.*, 889-892 (1983). Applications for such polymers include, among others:

1. formation into complex shapes and subsequent pyrolysis to give a ceramic material of the same shape;
2. spinning into continuous fibers whose subsequent pyrolysis yields ceramic fibers;
3. as a matrix material for carbon or ceramic fibers, or as a binder for ceramic powders (with subsequent pyrolysis to form a ceramic body);
4. oxidation-resistant coating on otherwise oxidizable materials (such as carbon/carbon composites)—after the polymer coating is made, it can be pyrolyzed to give the resistant ceramic coating;
5. infiltration of porous ceramic bodies such as ones obtained from reaction-sintered silicon nitride by the polymer itself (if liquid) or by a solution of the polymer, with subsequent pyrolysis to form a ceramic, resulting in better strength, oxidation resistance, etc., of the body; and
6. formation of thin films of the ceramic material for electronics applications.

For instance, Penn et al., *J. Appl. Polymer Sci.*, 27: 3751-61 (1982) describe the preparation of silicon carbide-silicon nitride fibers from a polycarbosilazane precursor. Tris(N-methylamino)methylsilane monomer was formed by reaction of monomethylamine and methyltrichlorosilane in dry petroleum ether and a polycarbosilazane resin was formed by passing the monomer over glass Raschig rings at 520° C. The brittle polymer was soluble in methylene chloride and chloroform, etc. This product was spun into fibers, crosslinked in air and then pyrolyzed to give ceramic fibers.

Other polymer precursors for forming silicon carbide and silicon nitride ceramics have been described in U.S. Pat. Nos. 3,108,985; 3,853,567; 3,892,583; 4,310,651 and 4,312,970. These linear or crosslinked polymers and processes for producing ceramic materials have generally been found to be deficient in one or more ways.

Another method uses $(CH_3)_2SiCl_2$ as a starting material. S. Yajima, *Amer. Ceram. Soc. Bull.*, 62: 893-898; 903 (1983). Although this method has been used commercially, the 2C:1Si stoichiometry of the starting material results in excess carbon being left after reaction. Methylsilicon compounds with a 1C:1Si stoichiometry are known. These include $CH_3SiCl_3$ and $CH_2SiHCl_2$. The former, however, yields mostly crosslinked insoluble products on treatment with an alkali metal in a compatible diluent making its use unsuitable. $CH_3SiHCl_2$, in theory, should give $[CH_3SiH]_n$ cyclic oligomers and linear polymers on reaction with an alkali metal. A process has been discussed where $CH_3SiHCl_2$ comprises about 30% of a mixed organochlorosilane reaction mixture which is thereafter treated with metallic potassium. See C. L. Shilling, Jr. and T. C. Williams, *Technical Report*, ONR Contract N00014-81-C-0682 (1983); *Gov. Rep. Announce. Index (U.S.)*, 84 (18):48 (1984). The 30% $CH_3SiHCl_2$ contribution yielded a final product, $[(CH_3SiH)_{0.2}(CH_3Si)_{0.8}]$.

It would be useful to have a polymer precursor that is formed from readily available and relatively cheap starting materials, that is stable at room temperature, is soluble in organic solvents and whose pyrolysis can provide a high yield of ceramics upon pyrolysis.

SUMMARY OF THE INVENTION

It has now been found that the hydrosilylation reaction of (A) organopolysilanes of the formula $[(RSiH)_x(RSi)_y]_n$ (where R is a lower alkyl group having from 1 to about 6 carbon atoms, a cycloaklyl group having from 3 to about 6 carbon atoms, a substituted or unsubstituted lower aryl group having from 6 to about 10 carbon atoms, $x+y=1$ (x and y are each $>0$ and also the case where $x=1$ and $y=0$) and n is an integer greater than 1) with (B) an organic or organosilicon compound having at least two alkenyl groups converts these compounds into materials of higher molecular weight whose pyrolysis provides a ceramic in high yield. The above reactants are mixed in an organic solvent. Thereafter, energy may be added to increase the rate of reaction. The reaction is preferably carried out in the presence of a suitable catalyst. Preferably a free radical or transition metal catalyst is used. More preferably one uses a free radical catalyst. The free radical catalyst can be a peroxide or an azo compound. More preferably the free radical catalyst is an azo compound.

The preceramic polymers of the present invention are formed by the above described hydrosilylation reaction. These polymers are then pyrolyzed to yield ceramic materials.

DETAILED DESCRIPTION OF THE INVENTION

The reaction of $CH_3SiHCl_2$ with an alkali metal produces methylsilicon compounds of the formula $[(CH_3SiH)_x(CH_3Si)_y]_n$ where $x+y=1$ and n is an integer greater than 1 (hereinafter these compounds will be referred to as "methylpolysilanes"). However, this product is not very useful as a preceramic polymer. Those methylpolysilanes which upon pyrolysis gave a ceramic yield greater than 50% had only a limited solubility in organic solvents. Such methylpolysilanes are difficult to process. Further, the conversion of these polymers to ceramic fibers generally requires a separate photolysis-oxidation cure step. The methylpolysilanes which were more soluble in organic solvents because their cross-linking was not as excessive, in contrast, usually provide an unacceptably low ceramic yield on pyrolysis, e.g., 12-27% in various runs. The methylpolysilanes of the above formula typically contain an excess of free silicon upon pyrolysis rather than the desired one silicon to one carbon composition. Consequently, alkali metal condensation of $CH_3SiHCl_2$ does not result in an ideal preceramic polymer for the generation of SiC.

We have now found that a very useful type of preceramic polymer is that which results from the hydrosilylation reaction between (A) organopolysilanes of the formula $[(RSiH)_x(RSi)_y]_n$ (where R is a lower alkyl group having from 1 to 6 carbon atoms, a cycloalkyl group having from 3 to about 6 carbon atoms, a substituted or unsubstituted lower aryl group having from 6 to about 10 carbon atoms, n is an integer greater than 1 and x+y=1 (x and y are each >0 and also x=1, y=o) and (B) an organic or organosilicon compound containing at least two alkenyl group is extremely useful. The preceramic compound obtained after reacting the above described organopolysilanes with the alkenyl-containing organic or organosilicon compounds in an organic solvent on pyrolysis generally results in ceramic yields greater than 50%. This resulting preceramic polymer generally is soluble in organic solvents and gives higher ceramic yields on pyrolysis than the organopolysilane resulting from alkali metal condensation of $CH_3SiHCl_2$.

One can use any organopolysilane of the formula $[(RSiH)_x(RSi)_y]_n$ which is soluble in the organic solvent being used. While the organopolysilane is generally poly(cyclic), i.e., y>o, one can use linear polymers of the above formula where x=1, y=0. A polymer where x=1 and y=0 which we have converted to a preceramic polymer is $[C_6H_5SiH]_n$, poly(phenylsilylene). This polymer has been described by Aitken, C. et al, *J. Organomet. Chem.*, 279:C11-C13 (1985). With any of the organopolysilanes discussed herein, R is preferably a lower alkyl, more preferably, R is $CH_3$. However, mixtures of compounds containing different R groups can be used. Additionally, mixtures of compounds of the aforesaid general formula, i.e., $[(RSiH)_x(RSi)_y]_n$ and $[(R'SiH)_{x'}(R'Si)_{y'}]_{n'}$, can be used to obtain further flexibility in tailoring the properties of the product. R', x', y' and n' have the same meaning as R, x, y and n above. These mixtures are particularly useful to obtain a ceramic product that has no excess free silicon or excess free carbon.

Organic or organosilicon compounds containing at least two alkenyl groups are preferably used in the present invention. More preferably, one uses cyclic organic or organosilicon compounds containing at least three alkenyl substituents. The molar ratio of SiH groups in the polysilane to alkenyl groups in the organic or organosilicon compound is preferably greater than 3, more preferably it is 6 or more.

The types of alkenyl-containing organic or organosilicon compounds that can be used are readily determined by a person of ordinary skill in the art. The alkenyl group itself is preferably a lower alkenyl having 2 to 6 carbon atoms such as vinyl, allyl, 3-butenyl, α-propenyl, α-styryl, etc. More preferably the alkenyl group used is vinyl, $CH_2=CH$. Also, the compounds can be wholly organic polyvinyl compounds such as divinylbenzene or a polybutadiene with a high 1, 2 content. More preferably, polyvinyl silicon compounds are used. Polyvinyl silicon compounds include those of the formula $[R^1_2(CH_2=CH)Si]_2Y$, $[R^1(CH_2=CH)]_2Y$ or $[(CH_2=CH)_3Si]_2Y$, where Y=O, S, NH, $NR^2$, $CH_2$, $CH_2CH_2$,

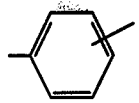

(o, m, or p) and other organic bridges; additionally Y may be absent, i.e., as in $R^1_n(CH_2=CH)_{3-n}Si—Si(CH=CH_2)_{3-q}R^1_q$ (n, q=0,1,2); n may equal q or be different; $(CH_2=CH)_4Si$; $cyclo[R^1(CH_2=CH)SiY^1]_m$ or $[(CH_2=CH)_2SiY^1]_m$, where $Y^1$ is O, S, NH, $NR^2$, m is 2 or greater, where $Y^1$ is NH, $NR^2$, S, $CH_2$; m is 3 or greater for O; $R^1$ is a substituted or unsubstituted lower alkyl having 1-6 carbon atoms or a substituted or unsubstituted lower aryl group having 6-10 carbon atoms, $R^2$ is defined as is $R^1$ and can be the same or different. These examples are illustrative and not meant to be restrictive. These compounds can have a substituted vinyl group, an allyl group, or a substituted allyl group in place of the vinyl group.

Polyvinyl silicon compounds useful in the present invention can readily be prepared by well known synthesis techniques. For example, using commercially available methylvinyldichlorosilane one can readily obtain, $cyclo-[(CH_3)(CH_2=CH)SiO]_m$, m equals 4, 5 or 6; $cyclo-[(CH_3)(CH_2=CH)SiNH]_m$, m equals 3 and 4; and $cyclo-[(CH_3)(CH_2=CH)SiS]_m$, m equals 3, when the methylvinyldichlorosilane is reacted with $H_2O$, $NH_3$ or $Li_2S$, respectively. These poly(vinyl) compounds react readily with the organopolysilane in an organic solvent in the presence of a catalyst.

The hydrosilyation reaction can be initiated by means well known to those of ordinary skill in the art. Such initation means include ultraviolet irradiation or more preferably catalytic initiation. A catalyst may be added which on appropriate input of energy provides reactive free radicals. Catalysts that can be used in the practice of this invention include transition metal catalysts or free radical catalysts.

The various catalysts that can be used are well known in the art. Transition metal hydrosilylation catalysts include but are not limited to complexes of platinum (including $H_2PtCl_6.6H_2O$), rhodium, ruthenium iridium, palladium, nickel, cobalt, iron, manganese and other metals, as summarized in Lukevics, E. et al, *J. of Organom. Chem. Library*, 5:1-180 (1977). When transition metal catalysts are used, the prepolymer product should preferably be treated to remove the metal species before forming the ceramic product. The free radical catalysts include peroxide and azo compounds. These compounds are well known to those of ordinary skill in the art. For example, the peroxide can be an organic peroxide such as benzoyl peroxide. Most preferably, one utilizes azo compounds. Such azo catalysts are well known to those skilled in the art and are readily available and include azobisisobutyronitrile (AIBN), other $R^3(CH_3)CN)CN=NC(CN)(CH_3)R^3$ compounds ($R^3=C_2H_5$, iso-$C_4H_9$), and the like.

To prepare the preceramic polymers of this invention, the organopolysilane is dissolved in an organic solvent, for example, xylenes, hexane, benzene, or tetrahydrofuran (THF). Most typically, a catalyst is then added to the solvent, and the resulting mixture is stirred at room temperatures until the catalyst dissolves. At this point the alkenyl containing organic or organosilicon compound is added to the mixture and sufficient energy is provided to cause the initiation of the hydrosilyation reaction. For example, the energy may be added by heating the reaction to 70°-90° C. for a sufficient time for the constituents to react. However, care must be taken to avoid excessively long heating times or an insoluble polymer may result. The resulting reaction mixture is cooled to room temperature and the preceramic polymer is removed from solution. This can be done by isolation techniques well known in the art. Typically, distillation methods are used, preferably trap-to-trap distillation, to remove volatile materials.

When ultraviolet irradiation is used, the reactants are combined in the organic solvent and then exposed to ultraviolet irradiation to initiate the reaction. Ultraviolet irradiation can also be used as the energy source along with a catalyst which is decomposed to radicals by such radiation.

The methods described herein generally result in the formation of preceramic polymers in nearly quantitative yield. Pyrolysis of the resulting preceramic polymers provides ceramic yields that are generally 50% or more. The polymer is pyrolyzed in a nitrogen or inert gas atmosphere for a sufficient time and at a sufficient temperature to form a ceramic product.

The use of the alkenyl-containing organic or organosilicon compound simplifies the process and/or improves the ceramic yield, but, more significantly, when the appropriate alkenyl-containing compound is reacted with an organopolysilane in the correct stoichiometry, the reaction product incorporates both starting materials. When this reaction product is pyrolyzed, the excess silicon normally obtained in the pyrolysis of the organopolysilane alone and the excess carbon introduced via the alkenyl-containing compound can combine so that there is no substantial excess of either element in the ceramic product. Consequently, one can obtain a ceramic product with less than about 0.5% of free silicon and/or less than about 0.5% of free carbon, i.e., a ceramic polymer containing virtually no free carbon and/or no free silicon. The exact combination of the two compounds necessary to result in the desired stoichiometry can be calculated by a person of ordinary skill in the art based on the results of the analyses of the ceramic products obtained from the pyrolysis of polymers of several different polysilane/alkenyl compound compositions, i.e., an empirical approach.

The invention will be further illustrated by the examples that follow:

A. GENERAL

All glassware was flame-dried under vacuum or under a stream of nitrogen prior to use. Tetrahydrofuran (THF) and benzene were distilled from sodium and benzophenone ketyl. Hexanes were distilled from $LiAlH_4$. Solvents were deoxygenated by bubbling nitrogen or argon gas through them prior to use. Methyldichlorosilane ($CH_3SiHCl_2$) and $(CH_3)(CH_2=CH)SiCl_2$ were purchased and were distilled from magnesium before use. Reagent grade sodium shot was further purified by creating a dispersion in refluxing xylene and allowing this to cool, with stirring. This served to remove most of the oxide coating.

$^1H$ NMR spectra were recorded on a JEOL-FX-90Q Spectrometer operating at 90 MHz. Molecular weights were determined by measuring the freezing point depression of a weighed sample of benzene caused by a weighed sample of product. Photolysis was performed in a Rayonet Photoreactor equpped with sixteen 360 nm medium pressure mercury lamps.

Thermal analyses were performed by using either a DuPont 950 TGA connected to a DuPont thermal analysis system or a Perkin-Elmer TGS-2 Thermogravimeter Analyzer interfaced with a System 7/4 Thermal Analysis Controller. Samples were heated, under nitrogen, from 25°–1000° C. at a rate of 10° C./min. Large scale pyrolyses were carried out in fused silica boats using a Lindberg 59344 tube furnace (25°–1000° C./min.) under a nitrogen atmosphere. Scanning electron micrographs were obtained using an AMR instrument, operating at 20 KV. X-ray powder diffraction pattern was obtained using a Phillips X-ray diffractometer with a CuK α radiation source and a Ni filter ($\lambda = 1.5418$ A).

B. PREPARATION OF $[(CH_3SiH)_x(CH_3Si)_y]_n$ OIL POLYMER IN HEXANE/THF MIXED SOLVENT

In a dry box, a 1 liter three-necked, round-bottomed flask equipped with a stir-bar, a dropping funnel and a reflux condenser was charged with 75.0 g (3.26 mol) of sodium metal. The flask was attached to a Schlenk manifold, evacuated and flushed with nitrogen. THF (70 ml) and hexane (420 ml) were added and the dropping funnel was charged with 150 ml (1.44 mol) of methyldichlorosilane. Methyldichlorosilane was added slowly into the flask over a 3 hour period. The reaction solution turned purple and by the end of the addition was at gentle reflux. The reaction mixture was stirred at room temperature for 2 hours and then heated at reflux for 16 hours. After it had been cooled to room temperature, the reaction mixture (except for the large NaCl crystals) was transferred via a cannula into a heavy-walled glass bottle. The mixture was centrifuged and the clear, colorless supernatant layer transferred by cannula into a 1 liter round-bottomed flask equipped with a stir-bar. Hexane (200 ml) and THF (20 ml) were added to the remaining solids, the mixture was centrifuged again, and the supernatant liquid combined with the first separated supernatant layer. Solvent was removed by trap-to-trap distillation until the volume of the residue was about 100 ml, and the remaining liquid was transferred by cannula into a weighed 250 ml round-bottomed flask. Remaining solvent was removed by trap-to-trap distillation at approximately 0.05 mm Hg at room temperature to give 51.2 g (81%, 1.16 mol) of a cloudy white oil.

$^1H$ NMR (90 MHz, $C_6D_6$): δ0.37 (broad, $SiCH_3$, 3.74H) 3.92 (broad, SiH, 1H).

NMR integration of the product gave a constitution of $[(CH_3SiH)_{0.8}(CH_3Si)_{0.2}]_n$.

IR (thin film, $cm^{-1}$): 2967(s), 2900(s), 2800(w), 2099(vs), 1410(s), 1385(w), 1249(s), 1055(br), 933(s), 865(vs), 770(vs), 685(br), 650(sh), 585(w).

Molecular weight (cryoscopic in benzene): 600 g/mol.

Anal. (material from another similar preparation). Calcd. for $CSiH_{3.76}$: C, 27.39; H, 8.55; Si, 64.05. Found: C, 27.49; H, 8.98; Si, 61.58%. TGA (24°–1000° C., 10° C./min): 20% yield of a gray-black ceramic solid. Pyrolysis of a sample from another preparation in a tube furnace gave a gray-black ceramic solid in 36% yield (by weight).

Anal. of Ceramic. Found: C, 22.93; Si, 75.99%.

The pure liquid obtained by this procedure is very air-sensitive, particularly when its effective surface area is high, as when in contact with a fritted funnel or a paper or cloth towel (in which cases spontaneous inflammation may occur).

Other, similar reactions have given 62–75% yields of $[(CH_3SiH)_x(CH_3Si)_y]_n$. Molecular weight determinations of several preparations ranged from 520–740 g/mol. All products had very similar $^1H$ NMR spectra, but with different $SiCH_3$:SiH ratios. Physical data of these products are listed in Table 1.

TABLE 1

| PHYSICAL DATA FOR $[(CH_3SiH)_x(CH_3Si)_y]_n$ POLYMERS | | | | | |
|---|---|---|---|---|---|
| Sample # | Polymer Yield (%) | Mol.[a] Weight | $SiCH_3$: $SiH^b$ | Ceramic[c] Yield (%) | x | y |
| YFY III-1 | 81 | 600 | 3.74:1 | 20 | 0.80 | 0.20 |
| YFY II-40 | 74 | 740 | 3.56:1 | 16 | 0.84 | 0.16 |

TABLE 1-continued

PHYSICAL DATA FOR [(CH$_3$SiH)$_x$(CH$_3$Si)$_y$]$_n$ POLYMERS

| Sample # | Polymer Yield (%) | Mol.[a] Weight | SiCH$_3$: SiH[b] | Ceramic[c] Yield (%) | x | y |
|---|---|---|---|---|---|---|
| YFY II-25 | 73 | 650 | 3.51:1 | 26 | 0.85 | 0.15 |
| YFY II-12 | 66 | 520 | 3.27:1 | 16 | 0.91 | 0.09 |
| YFY I-73 | 73 | 680 | 3.48:1 | 27 | 0.86 | 0.14 |

[a]Cryoscopic in benzene.
[b]$^1$H NMR integration ratio.
[c]Under nitrogen gas, 25–1000° C., 10° C./min (TGA)

For the purpose of simplifying calculation, an average formula weight value 44 was assigned for the unit (CH$_3$SiH)$_x$(CH$_3$Si)$_y$. Therefore, in each of the following experiments, the number of moles of the reaction unit (CH$_3$SiH) was calculated from the weight of the polymer used divided by 44.

C. PREPARATION OF VINYL-SILICON COMPOUNDS

1. Preparation of [(CH$_3$)(CH$_2$=CH)SiNH]$_3$

A one liter, three-necked, round bottomed flask was equipped with an overhead mechanical stirrer, a cold condenser (dry ice-acetone), and a septum and was flame-dried under a strong flow of nitrogen. Diethyl ether (50 ml) and (CH$_3$)(CH$_2$=CH)SiCl$_2$ (170 ml, 1.31 mol) were cannulated into the flask, which had been cooled to 0° C. with an ice bath. An excess of anhydrous ammonia was bubbled into the reaction mixture over approxiately 3 hours with vigorous stirring. The reaction mixture then was stirred at room temperature for 4 hours and subsequently was filtered in the dry box. The residue was washed with several portions of ether. The solvent was removed by trap-to-trap distillation at ca. 0.05 mmHg at room temperature to leave a clear residue (92.3 g, 83%). The product was purified by reduced pressure distillation to give 65.6 g (59%) of [CH$_3$(CH$_2$=CH)SiNH]$_3$ and 9.4 g (8.5%) of [CH$_3$(CH$_2$=CH)SiNH]$_4$. These products were further purified by repeated reduced pressure distillation.

[CH$_3$(CH$_2$=CH)SiNH]$_3$, bp 99°–100° C. (5 mmHg).

$^1$H NMR (90 MHz, C$_6$D$_6$): 5.92 (multiplet, SiCH=CH$_2$, 3H), 0.6 (broad, NH, 1H), 0.15 (multiplet, SiCH$_3$, 3H) (isomers present).

IR (neat, cm$^{-1}$): 3400(s), 3191(w), 3058(s), 3016(m), 2958(s), 2900(w), 1592(s), 1401(s), 1250(s), 1145–1180(s), 1006(s), 902–958(s), 840(s), 780(s), 720(s), 620(s).

Molecular weight (cryoscopic in benzene): 250 g/mol (calcd. 255). n$_D^{20}$ 1.4830 (n$_D^{20}$ 1.4810 reported in Andrianov, K. A., et al. Izv. Akad. Nauk SSSR, Otd. Khim. Nauk, 948 (1963) and 860 (Eng. Trans) and n$_D^{20}$ 1.4820 reported in Zhinkin, D. Y., et al., Zh. Obshch. Khim. 33:1293 (1963) (Eng. Trans.))

[CH$_3$(CH$_2$=CH)SiNH]$_4$, bp 116°–118° C. (3 mmHg).

$^1$H NMR (90 MHz, C$_6$D$_6$): 6.00 (multiplet, SiCH=CH$_2$, 3H), 0.5 (broad, NH, 1H), 0.16 (multiplet, SiCH$_3$, 3H) (isomers present).

IR (neat, cm$^{-1}$): 3393(s), 3191(w), 3056(s), 3008(w), 2960(s), 2901(w), 1596(s), 1401(s), 1253(s), 1157–1198(s), 1006(s), 915–967(s), 867(s), 785(s), 747(s), 678(m), 610(s).

Molecular weight (cryoscopic in benzene): 320 g/mol. n$_D^{20}$ 1.4962 (reported in Andrianov, supra n$_D^{20}$ 1.4980.)

In the following experiments, the distilled trimmer, [(CH$_3$)(CH$_2$=CH)SiNH]$_3$, was used.

2. PREPARATION OF [(CH$_3$)(CH$_2$=CH)SiO]$_m$ m=4,5,6

A 500 ml three-necked, round-bottomed flask equipped with a stir-bar, a reflux condenser, and a serum cap was charged with 65 ml (0.5 mol) of (CH$_3$)(CH$_2$=CH)SiCl$_2$ and 250 ml of diethyl ether. The solution was cooled to 0° C. (ice-water bath). To the solution was added 10 ml of H$_2$O, slowly by syringe. The ice-water bath was removed and the reaction mixture was stirred at room temperature for 24 hours. Five 200 ml portions of H$_2$O were added to the reaction mixture. The ether layer was washed with two 100 ml portions of H$_2$O and dried over MgSO$_4$. The solvent was removed by rotary evaporation to give 40.5 g of clear oil (94% yield based on [(CH$_3$)(CH$_2$=CH)SiO] unit). Gas chromatography analysis showed the product to be a mixture of [(CH$_3$)(CH$_2$=CH)SiO]$_m$, where m=4,5,6 (50% m=4, 30% m=5, 10% m=6). No further purification has been attempted, and in the experiments below this mixture of cyclics was used.

Physical data for the mixture:

$^1$H NMR (90 MHz, C$_6$D$_6$): δ5.97 (multiplet, SiCH=CH$_2$, 1H), 0.27 (broad, singlet, SiCH$_3$, 1H) (isomers present).

IR (neat, cm$^{-1}$): 3050(m), 3012(w), 2958(m), 2944(m), 1915(w), 1592(m), 1401(s), 1253(s), 1075(br,s), 1004(s), 952(s), 790(broad, s), 748(s), 680(m).

The compound where n32 4 was collected (preparative GC) and fully characterized:

$^1$H NMR (90 MHz, C$_6$D$_6$): δ5.95 (multiplet, SiCH=CH$_2$, 1H), 0.26 (multiplet, SiCH$_3$, 1H) (isomers present).

IR (neat, cm$^{-1}$): 3060(m), 3010(w), 2985(m), 1925(w), 1600(m), 1408(s), 1260(s), 1075(br,s) 1008(s), 790(s), 748(s).

Mass spectrum:

| m/e | Ion |
|---|---|
| 329 | M$^+$ - CH$_3$ |
| 317 | M$^+$ - CH$_2$=CH |
| 301 | M$^+$ - SiCH$_3$ |
| 289 | M$^+$ - SiCH$_3$CH$_2$=CH |
| 275 | M$^+$ - SiCH$_3$O |

Anal. Calcd. for Si$_4$C$_{12}$H$_{24}$O$_4$: C, 41.86; H, 7.02. Found: C, 41.97; H, 7.12.

The hydrolyses of methylvinyldichlorosilane and of methylvinyldiethoxysilane have been described in Kantor, S. W. et al., J. Am. Chem. Socl, 77:1685 (1955); Hurt, D. T., J. Am. Chem. Soc., 67:1812 (1945) which are incorporated herein by reference and the cyclic tetramer, pentamer and hexamer have been characterized as pure compounds.

3. PREPARATION OF [(CH$_3$)(CH$_2$=CH)SiS]$_3$

A 250 ml Schlenk flask equipped with a stir-bar and a serum cap was charged with 2.3 g (0.07 mol) of sulfur powder and 20 ml of THF. To the sulfur suspension 140 ml of LiBEt$_3$H solution (1M solution of THF, 0.14 mol, 2 equivalents) was added slowly by syringes (Gladysz, J. A. et al., Tetrahedron, 35:2329 (1979)). A reaction occurred immediately and the solution color changed from dark brown to yellow. The reaction mixture was stirred at room temperature for 1 hour. To the resulting yellow solution was added 10 ml (0.77 mol) of (CH$_3$)(CH$_2$=CH)SiCl$_2$ slowly by syringe. A reaction occurred immediately and the yellow solution turned cloudy. The reaction mixture was stirred at room temperature overnight. Solvent was removed by trap-to-trap distillation. The residue was extracted with 60 ml of hexane and the mixture was centrifuged. The supernatant liquid was transferred by cannula into a weighed 100 ml round-bottomed flask. Solvent again was removed by trap-to-trap distillation to give 5.4 g (75% yield) of a yellow oil.

$^1$H NMR (90 MHz, $C_6D_6$): δ5.93 (multiplet, $SiCH=CH_2$, 1H) 0.67 (multiplet, SiCH, 1H) (isomers present).

IR (neat, cm$^{-1}$): 3050(m), 3001(w), 2942(m), 1911(w), 1585(m), 1398(s), 1245(s), 1040(m), 998(s), 952(s), 780(s), 725(s), 651(s), 542(s).

Mass Spectrum:

| m/e | Ion |
|---|---|
| 306 | M$^+$ |
| 291 | M$^+$ - CH$_3$ |
| 279 | M$^+$ - CH$_2$=CH |
| 252 | M$^+$ - 2(CH$_2$=CH) |

1,3,5-Trimethyl-1,3,5-trivinylcyclotrisilthiane has been prepared previously by the reaction of $(CH_3)(CH_2=CH)SiCl_2$ with $H_2S$ in the presence of pyridine. More than one isomer was determined to be present (Millard, M. M. et al., *J. Organomet. Chem.*, 52:283 (1973)).

D. HYDROSILYLATION REACTION OF $[(CH_3SiH)_x(CH_3Si)_y]_n$ WITH $[(CH_3)(CH_2=CH)SiNH]_3$ INITIATED BY AIBN

The same general procedure was used for all of these reactions. In a dry box, a 100 ml three-necked, round-bottomed flask equipped with a stir-bar, a reflux condenser and a serum cap was charged with 1.89 g (0.043 mol) of $[(CH_3SiH)_x(CH_3Si)_y]_n$ (II-12). The flask was removed from the dry box and attached to a Schlenk manifold under nitrogen. Benzene (40 ml) was added by syringe to give a clear, colorless solution. AIBN (0.05 g, 0.30 mmol) was added as the solid against a countercurrent stream of nitrogen. The solution was stirred at room temperature for 5 minutes to dissolve the AIBN. To the solution was added 0.63 g (2.5 mmol, 7.5 mmol of $SiCH=CH_2$ unit) of $[(CH_3)(CH_2=CH)SiNH]_3$. The resulting solution was heated gently at reflux for 20 minutes. This solution should not be heated for more than 30 minutes or an insoluble polymer will form. The reaction mixture was allowed to cool to room temperature. The solvent was removed by trap-to-trap distillation to give 2.49 g (ca. quantitative yield) of a white powder identified as

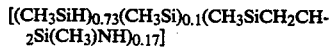

[(CH$_3$SiH)$_{0.73}$(CH$_3$Si)$_{0.1}$(CH$_3$SiCH$_2$CH$_2$Si(CH$_3$)NH)$_{0.17}$]

on the basis of the following data. The polymer is soluble in hexane, benzene, and THF.

$^1$H NMR (90 MHz, $C_6D_6$): δ4.04 (broad, SiH, 1H), 1.06 (singlet, SiCH$_2$CH$_2$Si), 0.44 (broad, SiCH$_3$, 5.9H for the total area of SiCH$_2$CH$_2$Si and SiCH$_3$).

Molecular weight (cryoscopic in benzene): 2100 g/mol TGA (25°–1000° C., 10° C./min): 77% yield of a black ceramic solid.

Anal. Calcd. for $C_1Si_{0.77}H_{3.37}N_{0.11}$: C, 31.21; H, 8.76; Si, 56.03; N, 4.00. Found: C, 31.30; H, 8.02; Si, 53.92; N, 4.05. (Total: 97.29%).

The polymer is given a formula

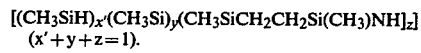

[(CH$_3$SiH)$_{x'}$(CH$_3$Si)$_y$(CH$_3$SiCH$_2$CH$_2$Si(CH$_3$)NH)$_z$]
(x'+y+z=1).

Assuming that $(CH_3Si)_y$ unit is not involved in the hydrosilylation reaction, therefore, the y value should be the same as that in the starting material, $[(CH_3SiH)_x(CH_3Si)_y]_n$. From this formula, the sum of 3x', 3y, and 11z divided by x' should be equal to the integrated ratio of SiCH$_3$ area and SiH area obtained from its $^1$H NMR sprectrum. In this case, the calculated values of x'=0.73 and z=0.17.

Ceramic Analyses: Large scale pyrolysis of a sample under N$_2$. (25°–1000° C., 10° C./min) (60–68% ceramic yield).

Residue found: C, 27.70; H, 0.18; Si, 68.36; N, 4.11. (Total: 100.35%).

This leads to a calculated composition: 0.033Si$_3$N$_4$+1SiC+0.04C (equivalent to 1.0 weight percent of free carbon).

A sample for X-ray powder diffraction was pyrolyzed in a tube furnace up to 1500° C. under a nitrogen atmosphere. The diffraction pattern showed only very broad peaks for β-SiC with no Si$_3$N$_4$ or free Si peaks. X-ray powder diffraction (d$_o$, A): 2.55(s), β-SiC, 2.47(s), β-SiC, 1.53(w), β-SiC.

Using the general procedure as described above, reactions between $[(CH_3SiH)_x(CH_3Si)_y]_n$ with different quantities of $[(CH_3)(CH_2=CH)SiNH]_3$ in different solvents were carried out. The preceramic polymers produced are set forth in Tables 2 and 3.

TABLE 2

Hydrosilylation Reactions of $[(CH_3SiH)_x(CH_3Si)_y]_n$ with $[(CH_3)(CH_2=CH)SiNH]_3^a$

| Sample Number | Solvent | Mole Ratio of SiH: SiCH=CH$_2$ | Reflux Time (Min.) | Polymer Solubility$^b$ |
|---|---|---|---|---|
| YFY-II-14 | Benzene | 2:1 | 120 | Insoluble |
| YFY-II-18 | Benzene | 3:1 | 10 | Insoluble |
| YFY-II-18-1 | Benzene | 3:1 | 5 | Soluble |
| YFY-II-19 | Benzene | 6:1 | 30 | Slightly soluble |
| YFY-II-26 | Benzene | 6:1 | 20 | Soluble |
| YFY-II-17 | Benzene | 6:1 | 10 | Soluble |
| YFY-II-21 | Hexane | 6:1 | 40 | Soluble |
| YFY-III-54 | Cyclohexane | 6:1 | 20 | Soluble |
| YFY-III-45 | Benzene | 8:1 | 20 | Soluble |
| YFY-III-46 | Benzene | 10:1 | 120 | Soluble |
| YFY-II-15 | Benzene | 12:1 | 150 | Soluble |

$^a$All of these reactions give quantitative yield.
$^b$Solubility of the polymer in hexane, benzene and THF.

TABLE 3

Physical Data of the Soluble Polymers Listed in Table 2

| Sample Number | TGA, Ceramic Yield$^a$ (%) | T$_\frac{1}{2}^b$ (°C.) | Molecular$^c$ Weight (g/mol) | $^1$H NMR$^d$ Integration Ratio |
|---|---|---|---|---|
| YFY-II-26 | 77 | 400 | 2100 | 1:5.9 |
| YFY-II-17 | 68 | 400 | 2120 | 1:6.0 |
| YFY-III-45 | 45 | 350 | 2040 | 1:6.9 |
| YFY-III-46 | 50 | 350 | 1550 | 1:6.5 |
| YFY-II-15 | 61 | 350 | 940 | 1:5.1 |
| YFY-II-21 | 60 | 410 | — | — |

TABLE 3-continued

Physical Data of the Soluble Polymers Listed in Table 2

| Sample Number | TGA, Ceramic Yield[a] (%) | $T_{\frac{1}{2}}$[b] (°C.) | Molecular[c] Weight (g/mol) | $^1$H NMR[d] Integration Ratio |
|---|---|---|---|---|
| YFY-III-54 | 53 | 420 | — | 1:6.1 |

[a]Under nitrogen, 25–1000° C., 10° C./min.
[b]Temperature at which one-half of the total weight loss had taken place.
[c]Cryoscopic in benzene.
[d]Ratio of SiH:(SiCH$_2$CH$_2$Si, SiCH$_3$ and NH).

E. HYDROSILYLATION REACTION OF [(CH$_3$SiH)$_x$(CH$_3$Si)$_y$]$_n$ WITH [(CH$_3$)(CH$_2$=CH)SiO]$_m$ (m=4,5,6) INITIATED BY AIBN

According to the procedure described previously, the reaction between [(CH$_3$SiH)$_x$(CH$_3$Si)$_y$]$_n$ (1.2 g, 0.027 mol, II-40), 0.05 g (0.30 mmol) of AIBN, and 0.4 g (0.0045 mol of (CH$_2$=CH)SiCH$_3$O unit) of [(CH$_3$)(CH$_2$=CH)SiO]$_m$ in 20 ml of benzene was carried out under a nitrogen atmosphere. The reaction mixture was heated gently at reflux for 10 minutes and then was allowed to cool to room temperature and stirred for an additional hour. The solvent was removed by trap-to-trap distillation to give 1.57 g (98% by weight) of a white powder. The polymer was assigned the formula

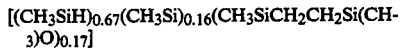

[(CH$_3$SiH)$_{0.67}$(CH$_3$Si)$_{0.16}$(CH$_3$SiCH$_2$CH$_2$Si(CH$_3$)O)$_{0.17}$]

on the basis of the following data. The polymer is soluble in hexane, benzene and THF.

$^1$H NMR (90 MHz, C$_6$D$_6$): δ4.03 (broad, SiH, 1H), 1.06 (singlet, SiCH$_2$CH$_2$Si), 0.44 (broad, SiCH$_3$, 6.2H for total area of SiCH$_2$CH$_2$Si and SiCH$_3$).

Molecular weight (cryoscopic in benzene): 3500 g/mol. TGA (25°–1000° C., 10° C./min): 73% yield of a black ceramic solid.

Using the same general procedure as outlined above, other reactions between [(CH$_3$SiH)$_x$(CH$_3$Si)$_y$]$_n$ with [(CH$_3$)(CH$_2$=CH)SiO]$_m$ in different mole ratios were carried out. The preceramic polymers produced are described in Tables 4 and 5.

Ceramic Anal.: Large scale pyrolysis of a sample under N$_2$ (25°–1000° C., 10° C./min) (69% ceramic yield).

Residue found: C, 29.65; H, 0.31; Si, 62.71; O, 7.25 Total: 99.9%.

This leads to a calculated composition: 1SiC+0.11SiO$_2$+0.23C.

TABLE 4

Hydrosilylation Reactions of [(CH$_3$SiH)$_x$(CH$_3$Si)$_y$]$_n$ with [(CH$_3$)(CH$_2$=CH)SiO]$_m$[a]

| Sample Number | Solvent | Mole Ratio of SiH: SiCH=CH$_2$ | Reflux Time (Min.) | Polymer Solubility[b] |
|---|---|---|---|---|
| YFY-II-60 | Benzene | 12:1 | 300 | Soluble |
| YFY-II-67 | Benzene | 9:1 | 120 | Soluble |
| YFY-II-61 | Benzene | 6:1 | 10 | Soluble |
| YFY-II-62 | Benzene | 3:1 | 11 | Insoluble |

[a]All of these reactions give quantitative yield.
[b]Solubility of the polymer in hexane, benzene and THF.

TABLE 5

Physical Data of the Soluble Polymers Listed in Table 4

| Sample Number | TGA, Ceramic Yield[a] (%) | $T_{\frac{1}{2}}$[b] (°C.) | Molecular[c] Weight (g/mol) | $^1$H NMR[d] Integration Ratio |
|---|---|---|---|---|
| YFY-II-60 | 60[e] | — | 1900 | 1:6.2 |
| YFY-II-67 | 63[e] | — | 3100 | 1:6.6 |
| YFY-II-61 | 73 | 370 | 3500 | 1:6.2 |

[a]Under nitrogen, 25–1000° C., 10° C./min.
[b]Temperature at which one-half of the total weight loss had taken place.
[c]Cryoscopic in benzene.
[d]Ratio of SiH:(SiCH$_2$CH$_2$Si and SiCH$_3$).
[e]Under nitrogen in a tube furnace.

F. HYDROSILYLATION REACTION OF [(CH$_3$SiH)$_x$(CH$_3$Si)$_y$]$_n$ WITH [(CH$_3$)(CH$_2$=CH)SiS]$_3$ INITIATED BY AIBN

According to the procedure described previously, the reaction between [(CH$_3$SiH)$_x$(CH$_3$Si)$_y$]$_n$ (1.1 g, 0.025 mol, II-40), 0.05 g (0.30 mmol) of AIBN, and 0.43 g (0.0042 mol) of [(CH$_3$)(CH$_2$=CH)SiS]$_3$ in 40 ml of benzene was carried out under a nitrogen atmosphere. The reaction mixture was heated gently at reflux for 10 minutes and then was allowed to cool to room temperature and stirred for an additional hour. The solvent was removed under reduced pressure to give 1.47 g (97% by weight) of a white powder. The polymer was assigned the formula

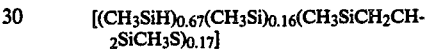

[(CH$_3$SiH)$_{0.67}$(CH$_3$Si)$_{0.16}$(CH$_3$SiCH$_2$CH$_2$SiCH$_3$S)$_{0.17}$]

on the basis of the following data. The polymer is soluble in hexane, benzene and THF.

$^1$H NMR (90 MHz, C$_6$D$_6$): δ3.98 (broad, SiH, 1H), 1.22 (singlet, SiCH$_2$CH$_2$Si), 0.39 (broad, SiCH$_3$, 6.5H for total area of SiCH$_2$CH$_2$Si and SiCH$_3$).

Molecular weight (cryoscopic in benzene): 3000 g/mol TGA (25°–1000° C., 10° C./min): 60% yield of a black ceramic solid. Ceramic Anal.: Large scale pyrolysis of the sample under N$_2$ (25°–1000° C., 10° C./min) (57% ceramic yield).

Found: C, 24.42; H, 0.58; Si, 60.44; S, 1.45. Total: 86.89%.

Using the same general procedure as outlined above, other reactions between [(CH$_3$SiH)$_x$(CH$_3$Si)$_y$]$_n$ with [(CH$_3$)(CH$_2$=CH)SiS]$_3$ in different mole ratios were carried out. The preceramic polymers produced are tabulated in Tables 6 and 7.

TABLE 6

Hydrosilylation Reactions of [(CH$_3$SiH)$_x$(CH$_3$Si)$_y$]$_n$ with [(CH$_3$)(CH$_2$=CH)SiS]$_3$[a]

| Sample Number | Solvent | Mole Ratio of SiH: SiCH=CH$_2$ | Reflux Time (Min.) | Polymer Solubility[b] |
|---|---|---|---|---|
| YFY-II-66 | Benzene | 12:1 | 1200 | Soluble |
| YFY-II-65 | Benzene | 6:1 | 10 | Soluble |
| YFY-II-68 | Benzene | 6:1 | 20 | Soluble |
| YFY-II-69 | Benzene | 4.5:1 | 6 | Insoluble |

[a]All of these reactions give quantitative yield.
[b]Solubility of the polymer in hexane, benzene and THF.

TABLE 7

Physical Data of the Soluble Polymers Listed in Table 6

| Sample Number | TGA, Ceramic Yield[a] (%) | $T_{\frac{1}{2}}$[b] (°C.) | Molecular[c] Weight (g/mol) | $^1$H NMR[d] Integration Ratio |
|---|---|---|---|---|
| YFY-II-66 | 50 | 340 | 2100 | 1:6.5 |

TABLE 7-continued

Physical Data of the Soluble Polymers Listed in Table 6

| Sample Number | TGA, Ceramic Yield[a] (%) | $T_{\frac{1}{2}}$[b] (°C.) | Molecular[c] Weight (g/mol) | 1H NMR[d] Integration Ratio |
|---|---|---|---|---|
| YFY-II-65 | 60 | 390 | 2900 | 1:6.5 |
| YFY-II-68 | 60 | 390 | 2800 | 1:6.6 |

[a]Under nitrogen, 25-1000° C., 10° C./min.
[b]Temperature at which one-half of the total weight loss had taken place.
[c]Cryoscopic in benzene.
[d]Ratio of SiH:(SiCH$_2$CH$_2$Si, SiCH$_3$).

G. HYDROSILYLATION REACTION OF $[(CH_3SiH)_x(CH_3Si)_y]_n$ WITH $[(CH_2\!=\!CH)Si(CH_3)_2]_2NH$ INITIATED BY AIBN

According to the procedure described previously, the reaction between $[(CH_3SiH)_x(CH_3Si)_y]_n$ (1.1 g, 0.025 mol, II-40), 0.05 g (0.30 mmol) of AIBN, and 1.4 ml (0.012 mol of Si(CH=CH$_2$) unit) of $[(CH_2\!=\!CH)Si(CH_3)_2]_2NH$ in 40 ml of benzene was carried out under a nitrogen atmosphere. The reaction mixture was heated gently at reflux for 24 hours and then was allowed to cool to room temperature. The solvent was removed under reduced pressure to give 2.14 g (95% by weight) of a white powder. The polymer was assigned the formula

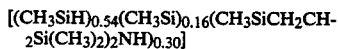

$[(CH_3SiH)_{0.54}(CH_3Si)_{0.16}(CH_3SiCH_2CH_2Si(CH_3)_2)_2NH)_{0.30}]$ on the basis of the following data. The polymer is soluble in hexane, benzene and THF.

1H NMR (90 MHz, C$_6$D$_6$): δ3.93 (broad, SiH, 1H), 0.11-1.12 (broad, SiCH$_3$, SiCH$_2$CH$_2$, NH 18H for the total area).

Molecular weight (cryoscopic in benzene): 1500 g/mol. TGA (25°-1000° C., 10° C./min): 28% yield of a black ceramic solid.

Anal. Calcd. for C$_1$Si$_{0.51}$H$_{2.9}$N$_{0.08}$: C, 39.46; H, 9.53; Si, 46.95; N, 3.73. Found: C, 41.29; H, 9.08; Si, 46.25; N, 3.88. Total: 100.5%

Using the same general procedure as outlined above, other reactions between $[(CH_3SiH)_x(CH_3Si)_y]_n$ with $[(CH_2\!=\!CH)Si(CH_3)_2]_2NH$ in different mole ratios were carried out. The preceramic polymers produced are set forth in Tables 8 and 9.

TABLE 8

Hydrosilylation Reactions of $[(CH_3SiH)_x(CH_3Si)_y]_n$ with $[(CH_2\!=\!CH)Si(CH_3)_2]_2NH$[a]

| Sample Number | Solvent | Mole Ratio of SiH: SiCH=CH$_2$ | Reflux Time (Hrs.) | Polymer Solubility[b] |
|---|---|---|---|---|
| YFY-II-50 | Benzene | 2:1 | 24 | Soluble |
| YFY-II-52 | Benzene | 3:1 | 20 | Soluble |
| YFY-II-55 | Toluene | 3:1 | 20 | Soluble |
| YFY-II-54 | Benzene | 4.5:1 | 24 | Soluble[c] |
| YFY-II-53 | Benzene | 6:1 | 20 | Soluble[c] |

[a]All of these reactions give quantitative yield.
[b]Solubility of the polymer in hexane, benzene and THF.
[c]Gummy solid.

TABLE 9

Physical Data of the Soluble Polymers Listed in Table 8

| Sample Number | TGA Yield[a] (%) | Molecular[b] Weight (g/mol) |
|---|---|---|
| YFY-II-50 | 28 | 1500 |
| YFY-II-52 | 32[c] | 1120 |
| YFY-II-55 | 32[c] | 1350 |

[a]Under nitrogen, 25-1000° C., 10° C./min.
[b]Cryoscopic in benzene.
[c]Under nitrogen in a tube furnace.

H. HYDROSILYLATION REACTION OF $[(CH_3SiH)_x(CH_3Si)_y]_n$ WITH $(CH_2\!=\!CH)_2C_6H_4$ INITIATED BY AIBN

According to the procedure described previously, the reaction between $[(CH_3SiH)_x(CH_3Si)_y]_n$ (1.1 g, 0.025 mole, II-40), 0.05 g (0.30 mmol) of AIBN, and 0.6 ml (0.0084 mole of (CH=CH$_2$) unit) of divinylbenzene (58.5% para, 40% meta, trace ortho; bp 60°-63° C./5 mmHg) in 20 ml of benzene was carried out under a nitrogen atmosphere. The resulting solution was heated gently at reflux for 40 hours and then was allowed to cool to room temperature. The solvent was removed by trap-to-trap distillation to give 1.57 g (95% by weight) of a white powder. The polymer was assigned the formula

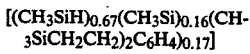

$[(CH_3SiH)_{0.67}(CH_3Si)_{0.16}(CH_3SiCH_2CH_2)_2C_6H_4)_{0.17}]$ on the basis of its 1H NMR spectrum.

1H NMR (90 MHz, C$_6$D$_6$): δ7.14 (broad, C$_6$H$_4$, 1.1H), 3.94 (broad, SiH, 1H), 2.50 (broad, SiCH$_2$CH$_2$—CH$_6$H$_4$, 0.9H), 0.26-1.11 (broad, SiCH$_3$, SiCH$_2$, 6H).

Molecular weight (cryoscopic in benzene): 1500 g/mol. TGA (25°-1000° C., 10° C./min): 55% yield of a black ceramic solid, $T_{\frac{1}{2}}=410°$ C.

Ceramic Anal.: Large scale pyrolysis of the sample under N$_2$ (25°-1000° C., 10° C./min) (52% ceramic yield). Found: C, 51.70; H, 0.54; Si, 46.48 Total: 98.72%. Composition: SiC+1.6C.

Using the same general procedure as outlined above, other reactions between $[(CH_3SiH)_x(CH_3Si)_y]_n$ with $(CH_2\!=\!CH)_2C_6H_4$ in different mole ratios were carried out. The preceramic polymers produced are tabulated in Tables 10 and 11.

TABLE 10

Hydrosilylation Reactions of $[(CH_3SiH)_x(CH_3Si)_y]_n$ with $[(CH_2\!=\!CH)_2C_6H_4]$[a]

| Sample Number | Solvent | Mole Ratio of SiH: SiCH=CH$_2$ | Reflux Time (Hrs.) | Polymer Solubility[b] |
|---|---|---|---|---|
| YFY-II-43 | Benzene | 6:1 | 40 | Soluble |
| YFY-II-44 | Benzene | 3:1 | 40 | Soluble |
| YFY-II-45 | Benzene | 2:1 | 20 | Soluble |
| YFY-II-51 | Benzene | 2:1 | 40 | Insoluble |
| YFY-II-47 | Toluene | 2:1 | 20 | Soluble |
| YFY-II-44-1 | Hexane | 2:1 | 16 | Liquid |
| YFY-II-44-2 | Hexane | 1:1 | 16 | Insoluble |
| YFY-II-49 | Benzene | 1:1 | 24 | Soluble |

[a]All of these reactions give quantitative yield.
[b]Solubility of the polymer in hexane, benzene and THF.

TABLE 11

Physical Data of the Soluble Polymers Listed in Table 10

| Sample Number | TGA, Ceramic Yield[a] (%) | $T_{\frac{1}{2}}$[b] (°C.) | Molecular[c] Weight (g/mol) | $^1$HNMR[d] Integration Ratio |
|---|---|---|---|---|
| YFY-II-44 | 55 | 410 | 1500 | 1.1:0:1:0.9:5.6 |
| YFY-II-45 | 48 | 400 | 1100 | 1.4:0.1:1:1:6.2 |
| YFY-II-49 | 54 | 460 | 840 | 2:0.5:1:1:5.9 |

[a]Under nitrogen, 25-1000° C., 10° C./min.
[b]Temperature at which one-half of the total weight loss had taken place.
[c]Cryoscopic in benzene.
[d]Ratio of $SiC_6H_4:CH_2$=$CH:SiH:SiCH_2CH_2C_6H_4:(SiCH_3$ and $SiCH_2)$.

I. HYDROSILYLATION REACTION OF $[(CH_3SiH)_x(CH_3Si)_y]_n$ WITH POLYBUTADIENE INITIATED BY AIBN

According to the procedure described previously, the reaction between $[(CH_3SiH)_x(CH_3Si)_y]_n$ (2.2 g, 0.05 mol, II-22), 0.05 g (0.30 mmol) of AIBN, and 0.6 g (0.005 mol of $CH_2$=CH unit) of polybutadiene (Aldrich #20050-6, containing 45% vinyl, 55% 1,4) in 40 ml of benzene was carried out under a nitrogen atmosphere. The reaction mixture was heated gently at reflux for 90 minutes and then was allowed to cool to room temperature. The solvent was removed by trap-to-trap distillation to give 2.74 g (98% by weight) of a white powder. The polymer is soluble in benzene.

$^1$H NMR (90 MHz, $C_6D_6$): δ5.30 (broad, $CH_2$=CH, 0.2H), 4.00 (broad, SiH, 1H), 1.55, 1.07 (singlet, $CH_2$ of polybutadiene), 0.44, 0.27 (broad, $SiCH_3$, 6H for total area of $SiCH_2CH_2Si$, $SiCH_3$, and $CH_2$).

Molecular weight (cryoscopic in benzene): Not soluble enough in benzene at the freezing point. TGA (25°-1000° C., 10° C./min): 47% yield of a black ceramic solid, $T_{\frac{1}{2}}$=380° C.

J. HYDROSILYLATION REACTION OF POLY(PHENYLSILYLENE) WITH $[(CH_3)(CH_2$=$CH)NH]_3$ INITIATED BY AIBN

Poly(phenylsilylene), $[C_6H_5SiH]_n$ was prepared by the method described by Aitken, C., supra.

$[(CH_3)(CH_2$=$CH)SiNH]_3$ (0.38 g, 1.5 mmol), AIBN (0.01 g) and 5 ml of benzene were placed in a 50 ml three-necked flask equipped with a reflux condenser, $[C_6H_5SiH]_n$ (0.47 g, 0.55 mmol) was added under nitrogen and the resulting solution was stirred at 60° C. for 30 minutes. Subsequently, the solvent was removed in vacuo overnight to leave 0.71 g (84%) of a colorless, viscous oil.

$^1$H NMR ($C_6D_6$: δ0-1.2 (broad, $SiCH_3$ and NH, 0.72H); 4.5-5.4 (broad, SiH, 0.23H); 5.6-6.3 (m, vinyl CH, 0.4H); 6.5-7.6 ($SiC_6H_5$, 1H).

Molecular weight (cryoscopic in benzene): 620 g/mol. TGA (25°-950° C., 10° C./min): 70% black solid.

In various reactions of this kind in which the $[(CH_3)(CH_2$=$CH)SiNH]_3/[C_6H_5SiH]_n$ mole ratio was varied between 2.7 and 8 and the reaction time at 60° C. between 30 minutes to up to 24 hours the products were viscous oils with molecular weight between 440 and 730, with one exception. Use of a ratio of 2.7, and a heating time of 24 hours gave a white solid product, molecular weight 1300.

The ceramic yields (TGA to 1000° C.) of all of these products varied between 67 and 75%.

A large scale reaction (ratio as defined above 2.9, 24 hours at 60° C., with 0.025 g AIBN, in benzene) gave a white solid, molecular weight 1260, in 87% yield.

Analysis Found: C, 54.24; H, 6.74; N, 4.80; Si, 29.03%.

A 2.52 g sample was pyrolyzed under argon to 1000° C. in a tube furnace to give a black ceramic material in 68% yield.

Analysis Found: C, 51.08; H, 0.62; N, 10.55; Si, 37.90%.

K. HYDROSILYLATION REACTION OF $[(CH_3SiH)_x(CH_3Si)_y]_n$ WITH $[(CH_3)(CH_2$=$CH)SiNH]_3$

1. Initiated by AIBN with UV Irradiation

In a dry box, a 100 ml round-bottomed quartz flask equipped with a stir-bar was charged with 2.2 g (0.05 mol) of $[(CH_3SiH)_x(CH_3Si)_y]_n$ (III-1) and 0.05 g (0.30 mmol) of AIBN. Benzene (50 ml) was added to dissolve the polymer and the catalyst. To the solution was added 0.71 g (0.0028 mol) of $[(CH_3)(CH_2$=$CH)SiNH]_3$. The resulting solution then was photolyzed for 45 minutes. The solvent was removed by trap-to-trap distillation to give 2.88 g (99% by weight) of a white powder. The polymer is only moderately soluble in benzene.

$^1$H NMR (90 MHz, $C_6D_6$): δ3.98 (broad, SiH, 1H), 1.06 (singlet, $SiCH_2CH_2Si$), 0.45 (broad, $SiCH_3$, 6.5H for the total area of $SiCH_2CH_2Si$ and $SiCH_3$).

Molecular weight: not soluble enough in benzene. TGA (25°-1000° C., 10° C./min): 54% yield of a black ceramic solid, $T_{\frac{1}{2}}$=400° C.

2. With UV Irradiation (no AIBN)

In a dry box, 100 ml round-bottomed flask equipped with a stir-bar was charged with 1.1 g (0.025 mol) of $[(CH_3SiH)_x(CH_2Si)_y]_n$ (III-53, x=0.78, y=0.22). Benzene (50 ml) was added to dissolve the polymer. To the solution was added 0.17 g (0.67 mmol) of $[(CH_3)(CH_2$=$CH)SiNH]_3$. The resulting solution then was photolyzed for 30 minutes. The solvent was removed by trap-to-trap distillation to give 1.23 g (97% by weight) of a white powder. The polymer is only moderately soluble in benzene.

$^1$H NMR (90 MHz, $C_6D_6$): δ4.01 (broad, SiH, 1H), 1.06 (singlet, $SiCH_2CH_2Si$), 0.46 (broad, $SiCH_3$, 6H for the total area of $SiCH_2CH_2Si$ and $SiCH_3$).

Molecular weight (cryoscopic in benzene): 1650 g/mol. TGA (25°-1000° C., 10° C./min): 59% yield of a black ceramic solid, $T_{\frac{1}{2}}$=350° C.

L. HYDROSILYLATION REACTION OF $[(CH_3SiH)_x(CH_3Si)_y]_n$ WITH $[(CH_3)(CH_2$=$CH)SiNH]_3$ INITIATED BY BENZOYL PEROXIDE

Essentially the same procedure was used in the reaction of $[(CH_3SiH)_x(CH_3Si)_y]_n$ (2.2 g, 0.050 mol, III-53), $[(CH_3)(CH_2$=$CH)SiNH]_3$ (0.70 g, 0.008 mol of SiCH=$CH_2$ unit), and 0.05 g of $(C_6H_5COO)_2$ (0.21 mmol) in 5 ml of benzene. The resulting solution was heated at reflux for 9 minutes under nitrogen. The solvent was removed by trap-to-trap distillation to give 2.85 g (98% by weight) of a white powder.

$^1$H NMR (90 MHz, $C_6D_6$): δ4.01 (broad, SiH, 1H), 0.47 (broad, $SiCH_2CH_2Si$ and $SiCH_3$, 6.75H for the total area).

Molecular weight (cryoscopic in benzene): 1060 g/mol. TGA (25°–1000° C., 10° C./min): 60% yield of a black ceramic solid, $T_{\frac{1}{2}} = 400°$ C.

Longer heating times gave insoluble products.

M. HYDROSILYLATION REACTION OF $[(CH_3SiH)_x(CH_3Si)_y]_n$ WITH $(CH_3)(CH_2=CH)SiNH]_3$ CATALYZED BY $H_2PtCl_6.6H_2O$

A mixture of $[(CH_3SiH)_x(CH_3Si)_y]_n$ (2.2 g, 0.050 mol, III-53), $[(CH_3)(CH_2=CH)SiNH]_3$ (0.7 g, 0.008 mol of SiCH=CH$_2$ unit), and 50 l of $H_2PtCl_6.6H_2O$ catalyst solution (1 g in 20 ml isopropyl alcohol) in 50 ml of benzene was heated at reflux for 18 hours. The solvent was removed by trap-to-trap distillation to give 2.75 g (95% by weight) of a light yellow solid.

$^1$H NMR (90 MHz, $C_6D_6$): $\delta 4.04$ (broad, SiH, 1H), 1.19 (broad, SiCH$_2$CH$_2$Si), 0.49 (broad, SiCH$_3$, 6.6H for the total area of SiCH$_2$CH$_2$Si and SiCH$_3$).

Molecular weight (cryoscopic in benzene): 2500 g/mol. TGA (25°–1000° C., 10° C./min): 57% yield of a black ceramic solid, $T_{\frac{1}{2}} = 400°$ C.

Using the same procedure as outlined above, the reactions between $[(CH_3SiH)_x(CH_3Si)_y]_n$ and $[(CH_3)(CH_2=CH)SiNH]_3$ in different mole ratios were carried out. The preceramic polymers produced are described in Table 12.

2. Preparation of Ceramic Bars by Polymer Pyrolysis

The polymer (3.0 g, III-2) was loaded into a 3.9 cm×1.3 cm×3.7 cm rectangular steel die and uniaxially pressed at 5000 lbs for 5 minutes. The polymer bar was then bagged and isostatically pressed at 40,000 psi for 1 minute. The sample was placed in a quartz tube in a tube furnace and pyrolyzed under nitrogen at 1000° C., heating at 10° C./min. A black rectangular shaped bar was obtained. The ceramic bar lost 49% of its original weight. SEM micrographs of the ceramic bar were obtained.

3. Preparation of SiC Powder Composites

In a dry box, 2.4 g of fine $\beta$-SiC powder and 0.6 g (20% by weight) of polymer (III-2) were combined in a 100 ml round-bottomed flask. The flask was removed from the dry box, charged with 10 ml of toluene, and the ceramic powder was dispersed ultrasonically for 1 hour. The toluene was removed on a rotary evaporator and the ceramic powder/polymer was dried further under vacuum for about 30 minutes. The residue was removed from the flask and lightly ground with a mortar and pestle to produce a fine powder. The powder was loaded into a 3.9 cm×1.3 cm×3.7 cm rectangular steel die and uniaxially pressed at 5000 lbs for 5 minutes. The bar of ceramic powder was then bagged and iso-

TABLE 12

Hydrosilylation Reactions of $[(CH_3SiH)_x(CH_3Si)_y]_n$ with $[(CH_3)(CH_2=CH)SiNH]_3$ Initiated by $H_2PtCl_6.6H_2O$.[a]

| Sample Number | Solvent | Mole Ratio of SiH:SiCH=CH$_2$ | Reaction Conditions | Polymer Solubility[b] | TGA Yield (%) | $T_{\frac{1}{2}}$ (°C.) |
|---|---|---|---|---|---|---|
| YFY-I-76-I | Xylene | 8:1 | Reflux 24 hours | Soluble Gummy Solid | 57 | 330 |
| YFY-I-79 | Benzene | 6:1 | Room Temp. 48 hours | Soluble Viscous Oil | 68 | 410 |
| YFY-III-70 | Benzene | 6:1 | Reflux 18 hours | Soluble Solid | 57 | 400 |
| YFY-II-1 | Xylene | 6:1 | Room Temp. 48 hours | Soluble Viscous Oil | 58 | 400 |
| YFY-II-11 | Benzene | 3:1 | Room Temp. 24 hours | Soluble Viscous Oil | 58 | 410 |
| YFY-II-6 | Xylene | 1:1 | Reflux 24 hours | Insoluble | — | — |
| YFY-II-8-1 | Hexane | 1:1 | Room Temp. 48 hours | Soluble Viscous Oil | 72 | 500 |

[a]All of these reactions give quantitative yield.
[b]Solubility of the polymer in hexane, benzene and THF.

N. CERAMIC APPLICATIONS

Polymer III-2 was prepared from $[(CH_3SiH)_x(CH_3Si)_y]_n$ and cyclo-$[(CH_3)(CH_2=CH)SiNH]_3$ (SiH/SiCH=CH$_2$ molar ratio=6) in refluxing benzene in the presence of AIBN.

1. Preparation of Ceramic Fibers

In a dry box, approximately 1 g of sample of III-2, Example D, (large scale preparation of II-26) was dissolved in toluene (ca. 10 ml). The solution was concentrated under vacuum until a fibrous, gummy material was obtained. Fibers approximately 1 ft long were pulled with a glass rod dipped into the gummy solid. The fibers were quickly placed in a fused silica crucible which was in turn placed in a quartz tube furnace and flushed with nitrogen. The polymer fibers then were converted into ceramic fibers by pyrolyzing them at 10° C./min to 1000° C. This produced black ceramic fibers. SEM micrographs of several fibers were taken.

statically pressed at 40,000 psi for 1 minute. The sample was placed in a quartz tube in a tube furnace and pyrolyzed under nitrogen to 1000° C., heating at 10° C./min. A slightly shrunk ceramic bar was formed which had lost 9% of its original weight. SEM micrographs of the ceramic bar were obtained.

This invention has been described in detail with reference to the preferred embodiments thereof. However, it will be appreciated that those skilled in the art upon consideration of this disclosure may make modifications and improvements within the scope and spirit of the invention as described in the claims.

We claim:

1. A method for preparing preceramic organosilicon polymers, wherein the method comprises:
   (a) mixing an organopolysilane of the formula $[(RSiH)_x(RSi)_y]_n$ with a sufficient quantity to undergo a hydrosilylation reaction of an organosilicon compound containing at least two alkenyl groups or a cyclic organic compound containing at least three alkenyl groups where x+6=1, 0<x<1, $0<y<1$, R is a lower alkyl group having from 1 to about 6 carbon atoms, a substituted or unsubstituted cycloalkyl group having 3 to about 6 carbon atoms, or a substituted or unsubstituted lower aryl group having from 6 to 10 carbon atoms, and n is an integer greater than 1, and (b) allowing the mixture of step (a) to react, neat or in an organic solvent, thereby forming said preceramic organosilicon polymer.

2. The method of claim 1 wherein the reaction of step (b) is initiated by the generation of reactive free radicals.

3. The method of claim 2 which further comprises adding a catalyst to the mixture of step (a) which on appropriate input of energy provides reactive free radicals.

4. The method of claim 3 wherein an energy source for free radical generation is heat.

5. The method of claim 2 wherein an energy source for free radical generation is ultraviolet irradiation in the presence or the absence of a catalyst.

6. The method of claim 2 wherein the free radical catalyst is selected from the group consisting of peroxides and azo compounds.

7. The method of claim 6 wherein the azo compound is azobisisobutyronitrile.

8. The method of claim 6 wherein the peroxide is an organic peroxide.

9. The method of claim 8 wherein the organic peroxide is benzoyl peroxide.

10. The method of claim 2 which further comprises adding a transition metal catalyst which is effective in hydrosilylation reactions to the mixture of step (a).

11. The method of claim 10 wherein the transition metal catalyst is $H_2PtCl_6 \cdot 6H_2O$.

12. The method of claim 1 wherein the organopolysilane and the alkenyl-containing organic or organosilicon compound and the compounds are added in an amount so that the mole ratio of SiH in the organopolysilane to the alkenyl group in the organic or organosilicon compound is larger than 3.

13. The method of claim 12 wherein the mole ratio is about 6 or larger.

14. The method of claim 3 wherein the mixture is heated to 70°–90° C.

15. The method of claim 4 wherein the mixture is heated to 70°–90° C.

16. The method of claim 2 wherein the alkenyl group is a lower alkenyl group having 2 to 6 carbon atoms.

17. The method of claim 16 wherein the alkenyl group is $CH_2=CH$.

18. The method of claim 1, wherein R is the lower alkyl group.

19. The method of claim 16, wherein R is a lower alkyl group.

20. The method of claim 18, wherein R is $CH_3$.

21. The method of claim 1 where $X=1$.

22. The method of claim 1, wherein the polymer product is pyrolyzed in a nitrogen or inert gas atmosphere for a sufficient time and at a sufficient temperature to form a ceramic product.

23. The method of claim 18 wherein the polymer is pyrolyzed in a nitrogen or an inert gas atmosphere for a sufficient time and at a sufficient temperature to form a ceramic product.

24. The method of claim 19 wherein the organic or organosilicon compound is selected from the group consisting of $[R^1_2(A)Si]_2Y$, $[R^1(A)_2Si]_2Y$, $[(A)_3Si]_2Y$, $R^1_n(A)_{3-n}Si-Si(A)_{3-q}R^1_q$, $(A)_4Si$, cyclo-$[R^1(A)SiY^1]_m$, and cyclo$[(A)_2SiY^1]_m$ where $Y=O$, S, NH, $NR^2$, $CH_2$, $CH_2CH_2$, or

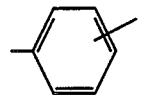

and other organic bridges; n and q are 0, 1 or 2, n may be the same or different than q; $Y^1=O$, S, NH, $NR^2$, $CH_2$, m is 2 or greater when $Y^1$ is NH, $NR^2$, S and $CH_2$, m is 3 or greater when $Y^1$ is O, $R^1$ is a substituted or unsubstituted lower alkyl group having 1–6 carbon atoms, or a substituted or unsubstituted lower aryl group having 6–10 carbon atoms, $R^2$ is defined as $R^1$ and can be the same or different; and A is a substituted or unsubstituted vinyl group or a substituted or unsubstituted allyl group.

25. The method of claim 24 wherein A is vinyl.

26. The method of claim 20 wherein the alkenyl-containing organosilicon compound is selected from the group consisting of
cyclo-$[(CH_3)(CH_2=CH)SiO]_4$,
cyclo-$[(CH_3)(CH_2=CH)SiO]_5$,
cyclo-$[(CH_3)(CH_2=CH)SiO]_6$, combinations of
cyclo-$[(CH_3)(CH_2=CH)SiO]_n$, $n=4$, and larger
cyclo-$[(CH_3)(CH_2=CH)SiS]_3$,
cyclo-$[(CH_3)(CH_2=CH)SiNH]_3$
cyclo-$[(CH_3)(CH_2=CH)SiNH]_4$, and combination of
cyclo-$[(CH_3)(CH_2=CH)SiNH]_n$, $n=3$ and larger.

27. The method of claim 24 wherein the organic or organosilicon compound is added in a sufficient quantity so that the excess carbon obtained on pyrolysis of the incorporated organic or organosilicon compound can react with excess silicon from the pyrolysis of the organopolysilane compound, thus producing a ceramic product which contains virtually no free silicon or free carbon.

28. The method of claim 24, wherein the organic or organosilicon compound is added in an amount so that a ceramic product produced by pyrolysis contains free carbon which has not reacted with silicon on pyrolysis.

29. The method of claim 24, wherein $[(RSiH)_x(RSi)_y]_n$ is added in an amount so that a ceramic product produced by pyrolysis contains free silicon which has not reacted with carbon on pyrolysis.

30. The method of claim 25 wherein the organosilicon compound is added in a sufficient quantity so that the excess carbon obtained on pyrolysis of the incorporated organisilicon compound can react with excess silicon from the pyrolysis of the methylpolysilane compound.

31. The method of claim 30 wherein the $R^1$ and $R^2$ are $CH_3$.

32. The method of claim 28 wherein $R^1$ and $R^2$ are $CH_3$.

33. The method of claim 29 wherein $R^1$ and $R^2$ are $CH_3$.

34. The method of claim 31 wherein the organopolysilane is $[(CH_3SiH)_x(CH_3Si)_y]_n$, x, y and n are as defined above.

35. The method of claim 34 wherein the mixture is heated to 70°–90° C.

36. The method of claim 35 wherein the polymer is pyrolyzed under an inert gas stream to about 1000° C. to 1300° C.

37. A preceramic polymer formed by the method of claim 1.

38. A preceramic polymer formed by the method of claim 12.

39. A preceramic polymer formed by the method of claim 13.

40. A preceramic polymer formed by the method of claim 21.

41. The method of claim 24 wherein m is 3 or greater.

42. The method of claim 28 wherein the organopolysilane is $[(CH_3SiH)_x(CH_3Si)_y]_n$, x, y and n are as defined above.

* * * * *